United States Patent [19]

Takeuchi et al.

[11] Patent Number: 5,299,164
[45] Date of Patent: Mar. 29, 1994

[54] SEMICONDUCTOR MEMORY DEVICE HAVING REDUNDANT CIRCUIT

[75] Inventors: Hideki Takeuchi; Shigeyuki Hayakawa, both of Yokohama; Tomoaki Yabe, Tokyo, all of Japan

[73] Assignee: Kabushiki Kaisha Toshiba, Kawasaki, Japan

[21] Appl. No.: 21,515

[22] Filed: Feb. 23, 1993

[30] Foreign Application Priority Data

Feb. 24, 1992 [JP] Japan .................................. 4-36073

[51] Int. Cl.$^5$ .............................................. G11C 29/00
[52] U.S. Cl. .................................. 365/201; 365/200; 365/184.05; 365/230.03; 365/230.06
[58] Field of Search .................. 365/201, 200, 189.05, 365/189.07, 230.03, 230.06

[56] References Cited

U.S. PATENT DOCUMENTS

| | | | |
|---|---|---|---|
| 4,656,610 | 4/1987 | Yoshida et al. | 365/230.03 |
| 4,914,632 | 4/1990 | Fujisuima et al. | 365/201 |
| 4,918,662 | 4/1990 | Kondo | 365/230.03 |
| 4,987,560 | 1/1991 | Hamano et al. | 365/200 |
| 5,083,294 | 1/1992 | Okajima | 365/200 |
| 5,124,948 | 6/1992 | Takizawa et al. | 365/230.03 |
| 5,243,570 | 9/1993 | Saruwatari | 365/201 |

Primary Examiner—Eugene R. LaRoche
Assistant Examiner—Tan Nguyen
Attorney, Agent, or Firm—Spensley Horn Jubas & Lubitz

[57] ABSTRACT

An internal row address signal output from an address buffer is supplied to first and second row partial decoders. A programming circuit is programmed to store information indicating whether the redundant function is used or not and a defective address corresponding to a defective main word line or defective memory cell in a main memory cell array. The defective row address and the internal row adders signal are compared with each other by the programming circuit and the spare decoder, a control signal corresponding to the coincidence/non-coincidence of the compared row addresses is output, and a partial decode signal of the internal row address signal is output when the compared row addresses coincide with each other. The second partial decoder receives a control signal output from the spare decoder and outputs a partial decode signal of the internal row address signal when the control signal indicates the non-coincidence of the compared row addresses. The partial decode signals output from the first and second row partial decoders are supplied to the main row decoder which in turn selects one of main word lines in the main memory cell array. The partial decode signal output from the spare decoder is supplied to a spare row decoder which in turn selects one of spare word lines in a spare memory cell array.

14 Claims, 9 Drawing Sheets

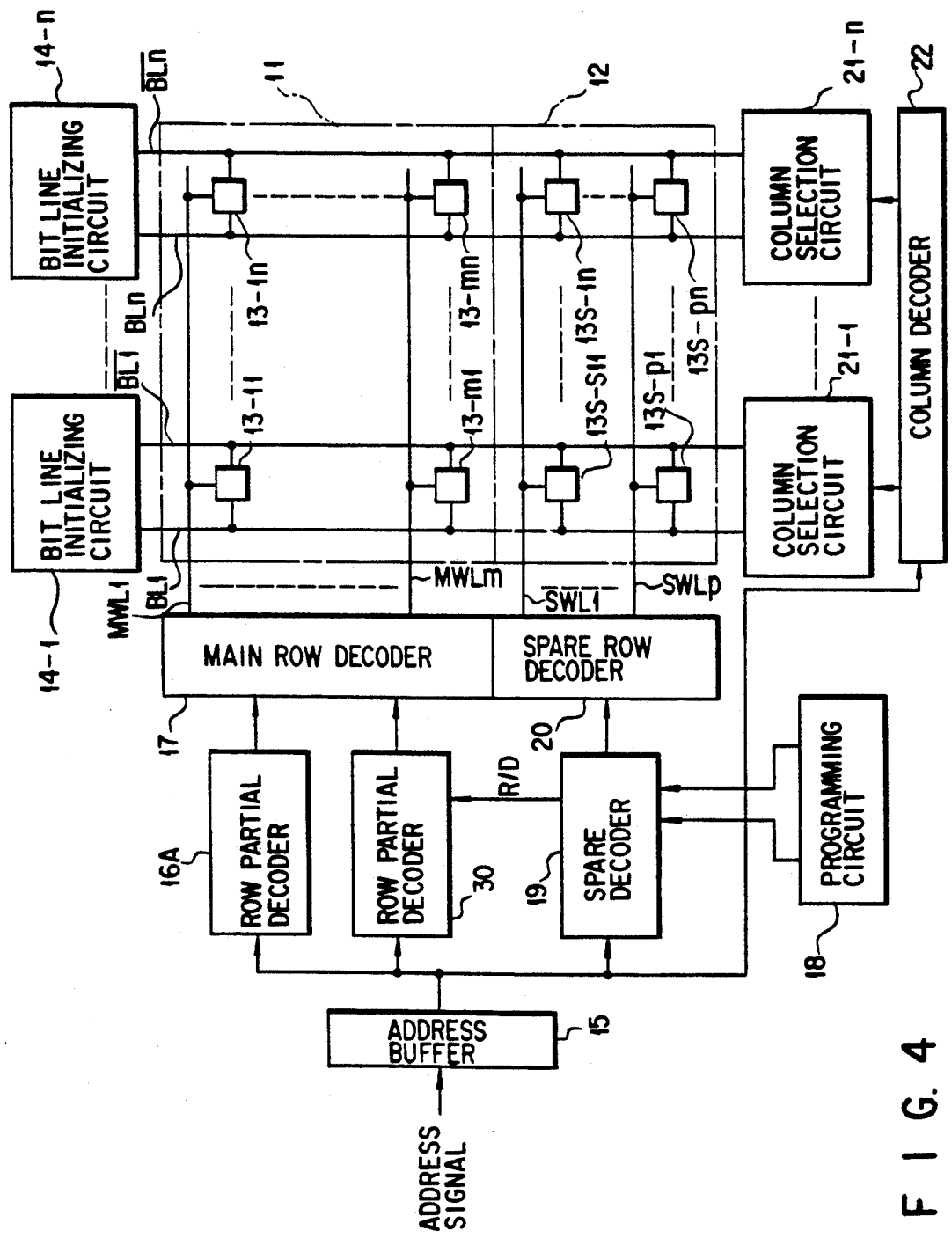
F I G. 4

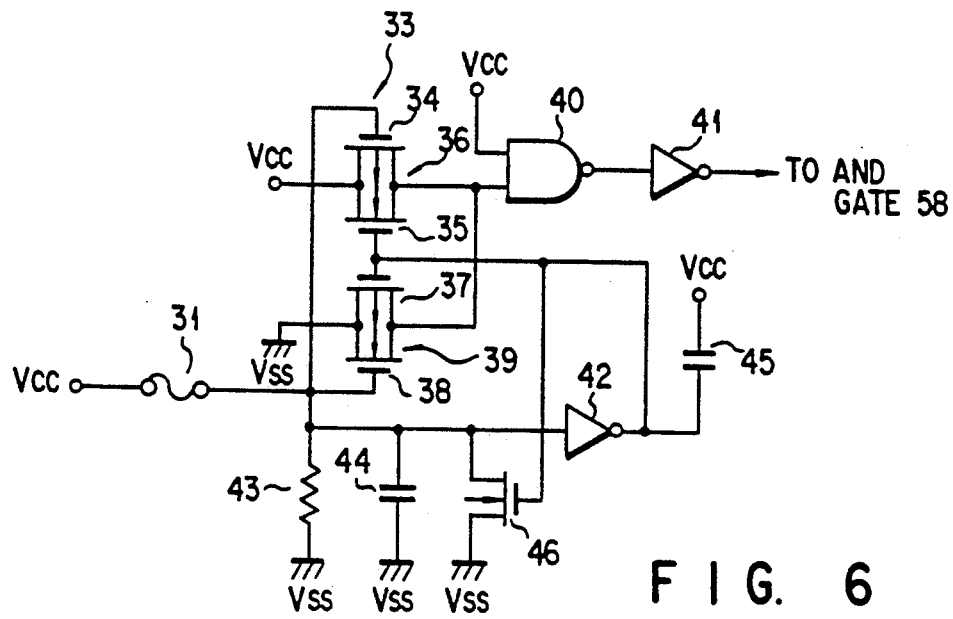
F I G. 6
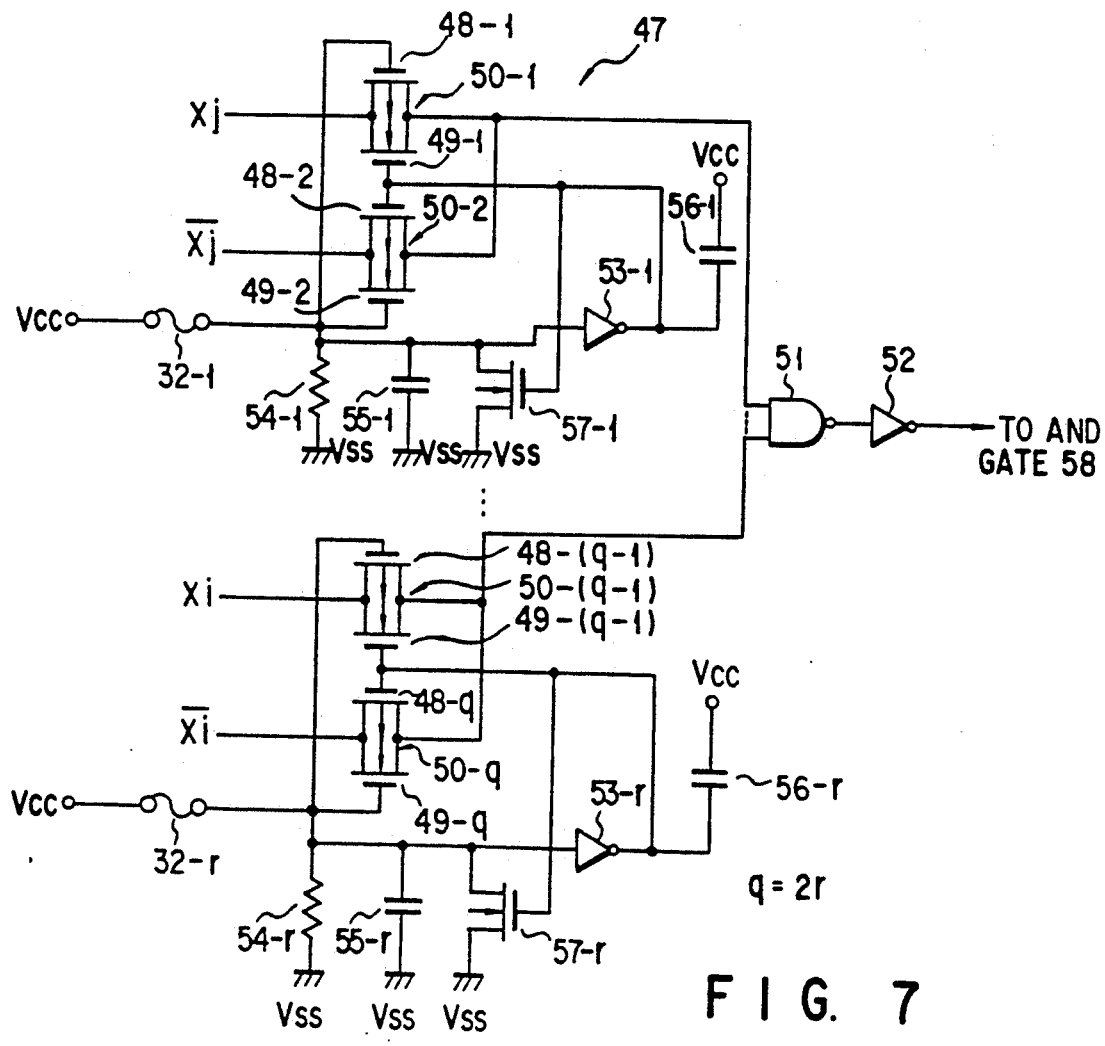
F I G. 7

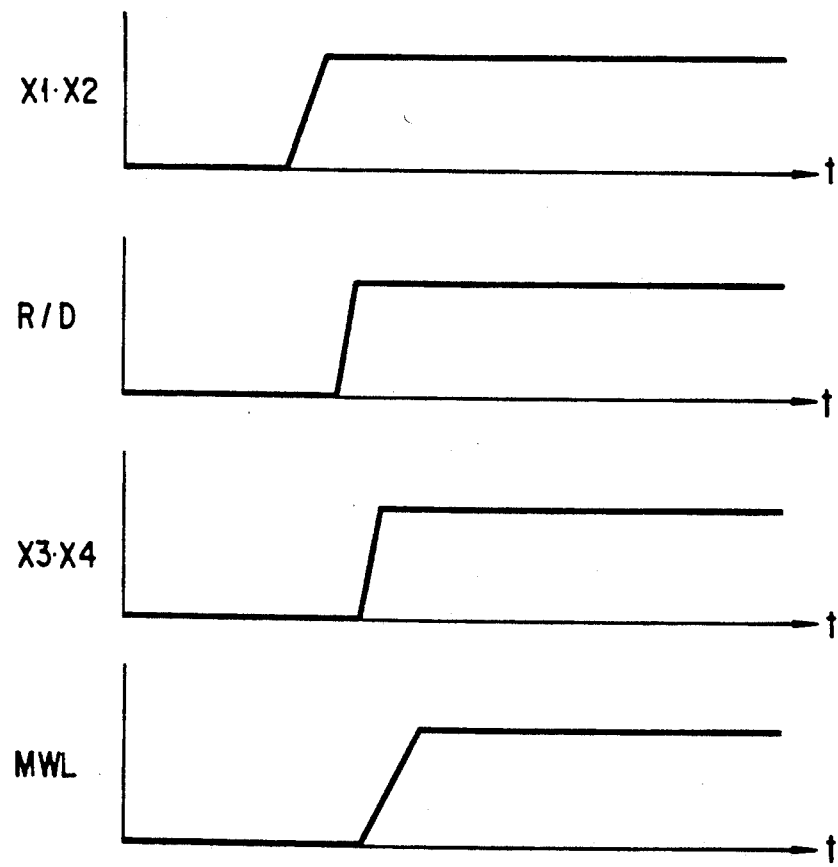
F I G. 10

SEMICONDUCTOR MEMORY DEVICE HAVING REDUNDANT CIRCUIT

BACKGROUND OF THE INVENTION

1. Field of the Invention

This invention relates to a random access type semiconductor memory device, and more particularly, to a semiconductor memory device having a redundant circuit for replacing a defective memory cell included in memory cells of a main memory cell array by a memory cell in a spare memory cell array for each unit of word line, that is, replacing the defective memory cell and memory cells connected to the same word line to which the defective memory cell is connected by memory cells connected to the same spare word line in the spare memory cell array.

2. Description of the Related Art

In the random access memory (RAM), as the memory capacity becomes larger, the possibility that a redundant circuit for relieving the defective memory cell is provided becomes higher. The redundant circuit includes a spare memory cell array having memory cells with the same construction as memory cells in the main memory cell array. In a case where defects occur in the memory cells of the main memory cell array or word lines, the memory cells connected to the same word line to which the defective memory cell is connected or the memory cells connected to the defective word line are replaced by the memory cells connected to the same spare word line in the spare memory cell array so as to relive the defective memory cell array, thus enhancing the manufacturing yield.

In order to permit the memory cells in the spare memory cell array to be selected instead of the memory cells in the main memory cell array, a plurality of programmable elements such as fuses are provided in the redundant circuit, and whether the redundant circuit is used or not is determined according to whether at least one of the fuses is cut off or not and a row address for the defective memory cell or defective word line is programmed by selectively cutting off the fuses. When a row address for a word line to which the defective memory is connected or the defective word line is input, one of the spare word lines is selected based on the program made by use of the fuses. At this time, all of the word lines in the main memory cell array are set in the non-activated state, thus permitting the spare memory cell in the spare memory cell array to be selected instead of the memory cell in the main memory cell array.

The conventional RAM having the above redundant circuit is constructed as shown in FIG. 1. An address signal constructed by row and column addresses for selecting a memory cell is supplied to an address buffer circuit 15. An output signal of the address buffer circuit 15 is supplied to row partial decoders 16A and 16B, spare decoder 19 and column decoder 22. The row partial decoders 16A and 16B decode respective internal row address signals output from the address buffer 15 to create partial decode signals. The partial decode signals are supplied to a main row decoder 17. The spare decoder 19 is supplied with an output of a programming circuit 18. The programming circuit 1 has fuses indicating whether or not the redundant function is used and fuses for programming an address for the defective memory cell. The spare decoder 19 decodes an internal row address signal supplied from the address buffer 15 to create a partial decode signal when the programming circuit 18 is programmed to use a redundant function and the programmed defective row address coincides with the above internal row address signal. The partial decode signal output from the spare decoder 19 is decoded by the spare row decoder 20 and the decoded signal is used to select and drive one of spare word lines SWL1 to SWLp. Further, the spare decoder 19 outputs to the main row decoder 17 a control signal R/D which is set to a low logic level when an internal row address signal corresponding to the defective row address is input and to a high logic level when a row address signal other than the internal row address signal is input. The main row decoder 17 decodes the partial decode signals of the row partial decoders 16A and 16B so as to select and drive one of the main word lines MWL1 to MWLm when the control signal R/D is set at the high logic level. On the other hand, when the control signal R/D is set at the low logic level, the main row decoder 17 selects none of the main word lines MWL1 to MWLm, and at this time, the spare row decoder 20 selects and drives one of the spare word lines SWL1 to SWLp.

A main memory cell array 11 is constructed by memory cells 13-11 to 13-mn arranged in a matrix form of m rows×n columns. A spare memory cell array 12 is constructed by memory cells 13S-11 to 13S-pn arranged in a matrix form of p rows×n columns. Each of the spare memory cells 13S-11 to 13S-pn has the same construction as the memory cells 13-11 to 13-mn. Those of the memory cells 13-11 to 13-mn in the main memory cell array 11 which are arranged on the same row are connected to a corresponding one of the main word lines MWL1 to MWLm and the memory cells 13-11 to 13-mn are selected for each row. Those of the memory cells 13S-11 to 13S-pn in the spare memory cell array 12 which are arranged on the same row are connected to a corresponding one of the spare word lines SWL1 to SWLp and the memory cells 13S-11 to 13S-pn are selected for each row. Those of the memory cells 13-11 to 13-mn and 13S-11 to 13S-pn in the main memory cell array 11 and spare memory cell array 12 which are arranged on the same column are connected to a corresponding one of bit line pairs BL1, $\overline{BL1}$ to BLn, $\overline{BLn}$. Each pair of bit lines BL1, $\overline{BL1}$ to BLn, $\overline{BLn}$ are connected at one end to a corresponding one of bit line initializing circuits 14-1 to 14-n for initializing the potentials of the pairs of bit lines BL1, $\overline{BL1}$ to BLn, $\overline{BLn}$. Further, each pair of bit lines BL1, $\overline{BL1}$ to BLn, $\overline{BLn}$ are connected at the other end to a corresponding one of column selection circuits 21-1 to 21-$n$ for selecting the pairs of bit lines BL1, $\overline{BL1}$ to BLn, $\overline{BLn}$. The input terminals of the column selection circuits 21-1 to 21-$n$ are connected to the output terminal of the column decoder 22 and one of the circuits 21-1 to 21-$n$ is selected according to the decode signal output from the column decoder 22.

FIG. 2 is a circuit diagram showing the detail construction of part of the main row decoder 17 in the RAM shown in FIG. 1. The circuit includes NAND gates 25 and inverters 26. For example, a row address signal is constructed by four bits of X1, X2, X3 and X4 and $\overline{X1}\cdot X2$, $X1\cdot\overline{X2}$, $\overline{X1}\cdot\overline{X2}$ and X1·X2 (for example, X1·X2 indicates an AND logic signal of X1 and X2 and $\overline{X1}\cdot\overline{X2}$ indicates an AND logic signal of an inverted signal of X1 and X2) shown in FIG. 2 are output signals of the row partial decoder 16A for deriving partial decode signals of the two-bit row address signals X1 and X2. Likewise, X3·X4, $\overline{X3}$·X4, X3·$\overline{X4}$ and $\overline{X3}$·$\overline{X4}$ are output signals of the row partial decoder 16 for deriving partial decode signals of the two-bit row address signals X3 and X4. Selected two of the partial decode signals and the control signal R/D are supplied to a corresponding on of the decoding three-input NAND gates 25. Outputs of the NAND gates 25 are respectively supplied to the inverters 26 serving as buffer circuits and the main word lines MWL are driven by outputs of the inverters 26.

FIG. 3 is a timing chart of signals in the main row decoder 17. As shown in FIG. 3, in a case where no redundant function is provided, the partial decode signals (which are represented by X1·X2 and X3·X4 in FIG. 3) rise at time T1 and then the control signal R/D rises to the high logic level at time T2, and after this, the main word line MWL is set to the high logic level at time T3. The time T2 at which the signal R/D rises must be set to a time point after the time T1 at which all of the other partial decode signals rise. This is because a defective word line may be selected or a main word line (which should not be selected) different from a to-be-selected main word line may temporarily be selected and the access time may be delayed by reverse reading of data before a correctly corresponding one of the word lines MWL1 to MWLm is selected in response to an address input if the signal R/D rises earlier than the other partial decode signals. Therefore, the spare decoder 19 is so constructed as to cause the signal R/D to be changed after the partial decode signals have changed, thereby causing the access time of the RAM to be determined based on the control signal R/D. Further, since the control signal R/D input to the main row decoder 17 is supplied to all of the decoding NAND gates 25 as shown in FIG. 2, the load capacitance becomes large and the time for the signal R/D to rise to the high logic level becomes longer (the rate of rise of the signal becomes dull) as shown by the timing chart of FIG. 3. As a result, the access time becomes further longer.

Further, if fall of the control signal R/D is delayed when the access is changed from the main memory cell array 11 to the spare memory cell array 12, multi-selection may occur at this time. If the driving ability of the circuit portion for outputting the control signal R/D is increased to reduce the rise time and fall time of the control signal R/D, a current consumption will increase.

SUMMARY OF THE INVENTION

Accordingly, a first object of this invention is to provide a semiconductor memory device capable of enhancing the access speed.

A second object of this invention is to provide a semiconductor memory device capable of effecting the stable operation.

A third object of this invention is to provide a semiconductor memory device whose current consumption is small.

The above first to third objects of this invention can be attained by a semiconductor memory device comprising a main memory cell array having memory cells arranged in a matrix form; main word lines each connected to those of the memory cells of the main memory cell array which are arranged on a corresponding row; a spare memory cell array having spare memory cells arranged in a matrix form, the spare memory cells of the same number as the memory cells connected to one main word line being arranged on each row; spare word lines each connected to those of the spare memory cells of the spare memory cell array which are arranged on a corresponding row; a spare decoder having a defective row address programmed therein when at least one of the memory cells of the main memory cell array or at least one of the main word lines becomes defective, comparing the programmed defective row address with an input row address signal to check whether or not the compared addresses coincide with each other, outputting a control signal corresponding to the coincidence/non-coincidence of the compared row addresses, and outputting a first partial decode signal of the input address signal when the compared addresses coincide with each other; a spare row decoder for receiving the first partial decode signal and selectively driving the spare word lines; a row partial decoder for receiving the input row address signal and the control signal and outputting a second partial decode signal of the input row address signal when the control signal indicates the non-coincidence of the addresses; and a main row decoder for receiving the second partial decode output and selectively driving the main word lines.

With the above construction, a control signal indicating the coincidence/non-coincidence of the addresses and used for changing selection of the main memory cell array and the spare memory cell array is not input to the main row decoder unlike the conventional case, but is input to the row partial decoder which is provided in the preceding stage of the main row decoder and the row partial decoder derives a logical product of the partial decode signal and the control signal and supplies the logical product signal to the main row decoder so that the number of gate circuits to which the control signal is supplied can be reduced. As a result, the load capacitance of the circuit to be driven by the control signal becomes small, thereby making it possible to suppress the signal delay. Further, since the level variation speed of the control signal can be enhanced, the possibility of multiselection of the memory cells in the main memory cell array and the spare memory cell array can be lowered. In addition, since it is not necessary to enhance the driving ability of the buffer circuit for outputting the control signal, the current consumption can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram showing the schematic construction of a semiconductor memory device according to a first embodiment of this invention;

FIG. 6 is a circuit diagram showing an example of the construction of a program data generation circuit in the circuit of FIG. 5;

FIG. 7 is a circuit diagram showing an example of the construction of a defective address programming and comparing circuit in the circuit of FIG. 5;

FIG. 10 is a timing chart showing various signals in the circuit of FIGS. 4, 8 and 9.

DETAILED DESCRIPTION OF THE PREFERRED EMBODIMENTS

Figure 1:
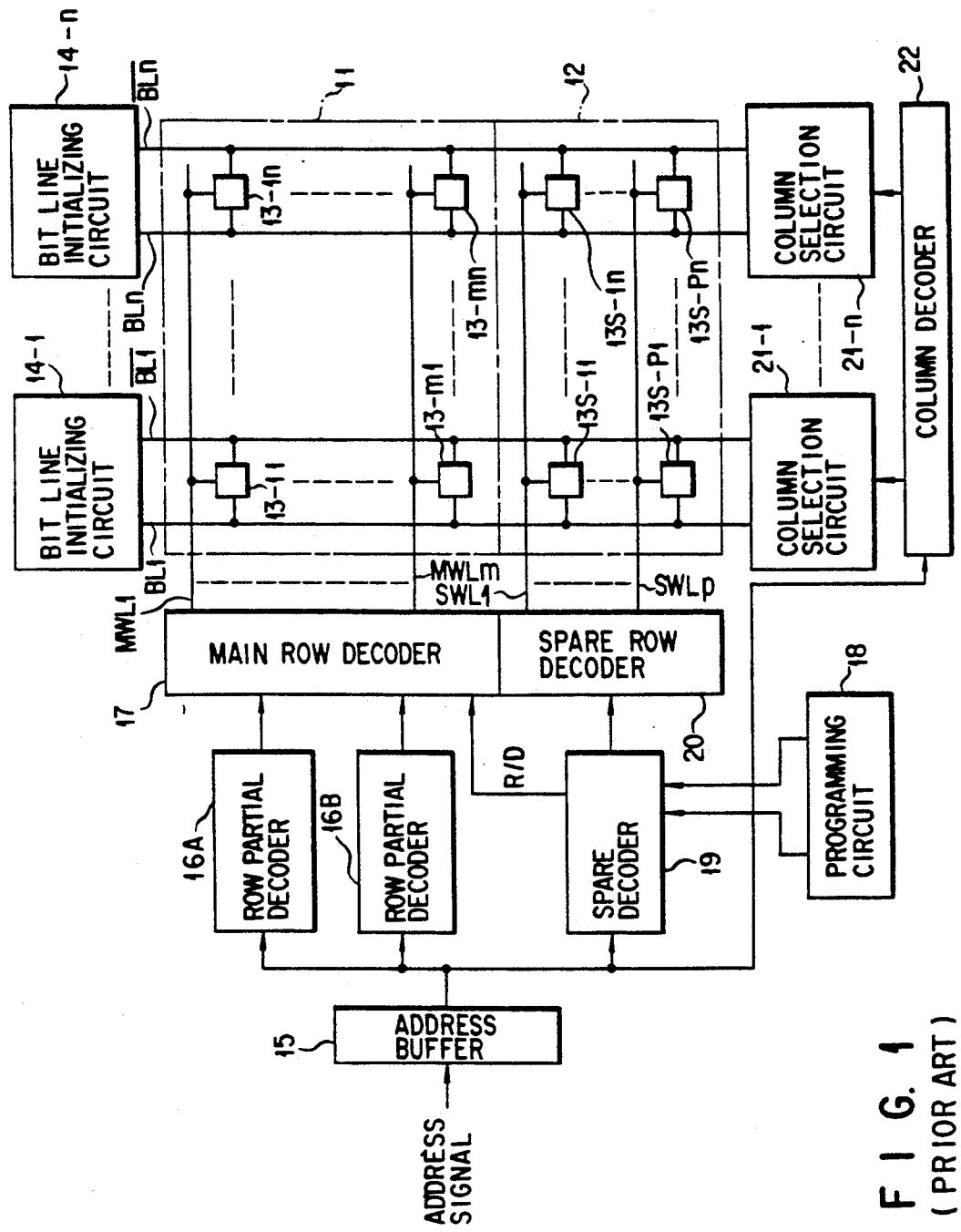
FIG. 1 is a block diagram showing the schematic construction of a conventional semiconductor memory device having a redundant circuit.
Figure 2:
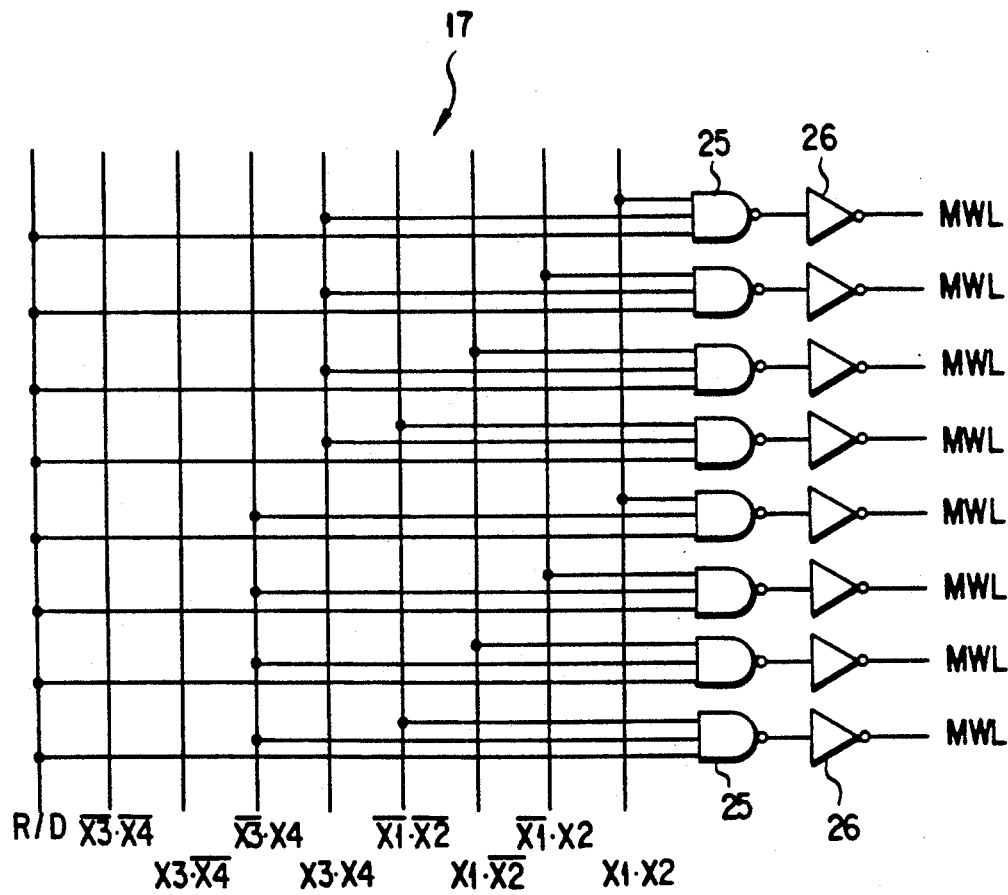
FIG. 2 is a circuit diagram showing the construction of part of a main row decoder of the circuit shown in FIG. 1.
Figure 3:
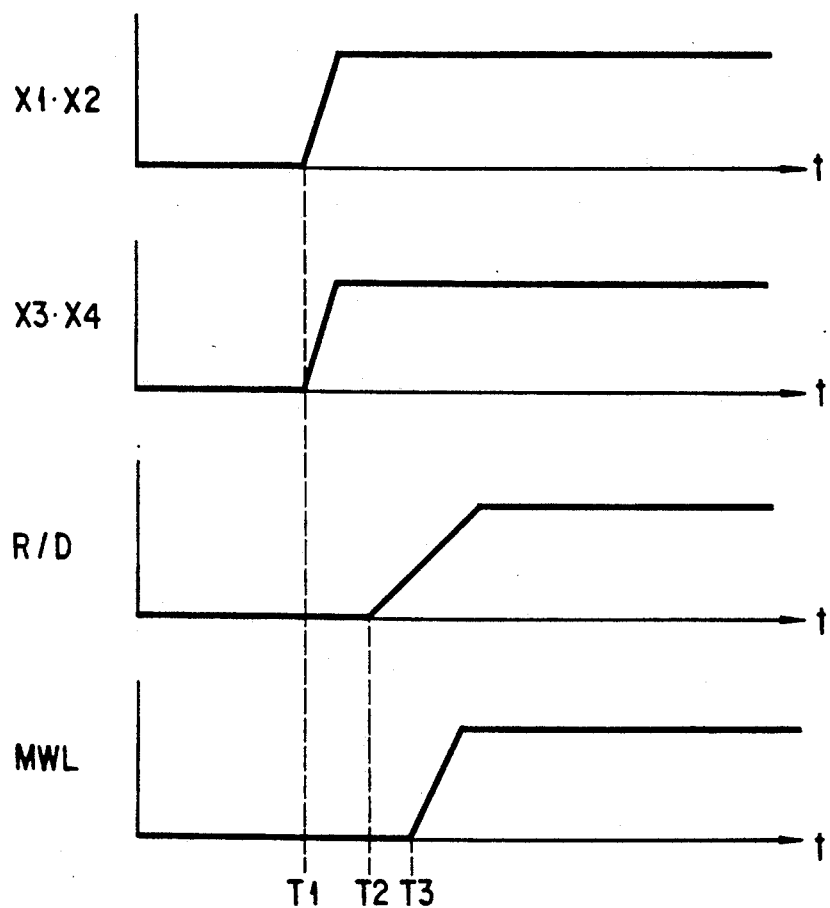
FIG. 3 is a timing chart showing various signals in the circuit shown in FIGS. 1 and 2.

FIG. 4 is block diagram for illustrating a semiconductor memory device according to a first embodiment of this invention and shows the schematic construction of a random access memory (RAM) having a redundant circuit. An address signal constructed by row and column addresses each having a plurality of bits and used for selecting a memory cell is supplied to an address buffer 15. The address buffer 15 outputs internal row and column address signals constructed by bit signals of the row and column address signals and the inverted signals thereof. The internal row address signal is supplied to row partial decoders 16A and 30 and spare decoder 19 and the internal column address signal is supplied to a column decoder 22. The row partial decoders 16A and 30 decode the internal row address signal output from the address buffer 15 to respectively create partial decode signals, and the respective partial decode signals are supplied to a main row decoder 17. The main row decoder 17 decodes the partial decode signals from the row partial decoders 16A and 30 to select and drive one of the main word lines MWL1 to MWLm. The spare decoder 19 is supplied with an output of a programming circuit 18. The programming circuit 18 includes fuses indicating whether the redundant function is used or not and a plurality of fuses for programming an address corresponding to a defective word line. The spare decoder 19 decodes an internal row address signal supplied from the address buffer 15 to output a partial decode signal to a spare row decoder 20 when the programming circuit 18 is programmed to use a redundant function and the programmed defective row address coincides with the above internal row address signal. A decode signal output from the spare row decoder 20 is used to select and drive one of the spare word lines SWL1 to SWLp. Further, the spare decoder 19 outputs a control signal R/D which indicates the coincidence/non-coincidence between the defective row address programmed in the programming circuit 18 and the internal row address signal to the row partial decoder 30 so as to control the operation of the decoder 30. The control signal R/D is set to a low logic level when an internal row address signal corresponding to the defective row address (an address of a word line to which the defective memory cell is connected or an address of the defective word line) is input and set to a high logic level when an address signal other than the above internal row address signal is input. The main row decoder 17 receives and decodes the partial decode signals from the row partial decoders 16A and 30 so as to select and drive one of the main word lines MWL1 to MWLn when the control signal R/D is set at the high logic level. On the other hand, when the control signal R/D is set at the low logic level, all of the outputs of the row partial decoder 30 are set at the low logic level to set the main word lines MWL1 to MWLm into the non-selected state, and at this time, the spare row decoder 20 selects and drives one of the spare word lines SWL1 to SWLp according to the row address programmed in the programming circuit 18.

A main memory cell array 11 is constructed by memory cells 13-11 to 13-mn arranged in a matrix form of m rows×n columns. A spare memory cell array 12 is constructed by memory cells 13S-11 to 13S-pn arranged in a matrix form of p rows×n columns. Those of the memory cells 13-11 to 13-mn in the main memory cell array 11 which are arranged on the same row are connected to a corresponding one of the main word lines MWL1 to MWLm and the memory cells 13-11 to 13-mn are selected for each row. Those of the memory cells 13S-11 to 13S-pn in the spare memory cell array 12 which are arranged on the same row are connected to a corresponding one of the spar word lines SWL1 to SWLp and the memory cells 13S-11 to 13S-pn are selected for each row. Those of the memory cells 13-11 to 13-mn and 13S-11 to 13S-pn in the main memory cell array 11 and spare memory cell array 12 which are arranged on the same column are connected to a corresponding one of bit line pairs BL1, $\overline{BL1}$ to BLn, $\overline{BLn}$. Each pair of bit lines BL1, $\overline{BL1}$ to BLn, $\overline{BLn}$ are connected at one end to a corresponding one of bit line initializing circuits 14-1 to 14-n for initializing the potentials of the pairs of bit lines BL1, $\overline{BL1}$ to BLn, $\overline{BLn}$. Further, each pair of bit lines BL1, $\overline{BL1}$ to BLn, $\overline{BLn}$ are connected at the other end to a corresponding one of column selection circuits 21-1 to 21-n for selecting the pairs of bit lines BL1, $\overline{BL1}$ to BLn, $\overline{BLn}$. The input terminals of the column selection circuits 21-1 to 21-n are connected to the output terminal of the column decoder 22 and one of the circuits 21-1 to 21-n is selected according to a decode signal output from the column decoder 22. Each of the column selection circuits 21-1 to 21-n is constructed by two MOS transistors whose current paths are connected at one end to a corresponding pair of bit lines, for example. The column decoder 22 decodes the internal column address signal output from the address buffer 15 and turns on the two MOS transistors in one column selection gate circuit $21k$ ($k$ is an integer of 1 to n) to select a pair of bit lines BLk and $\overline{BLk}$.

Figure 5:
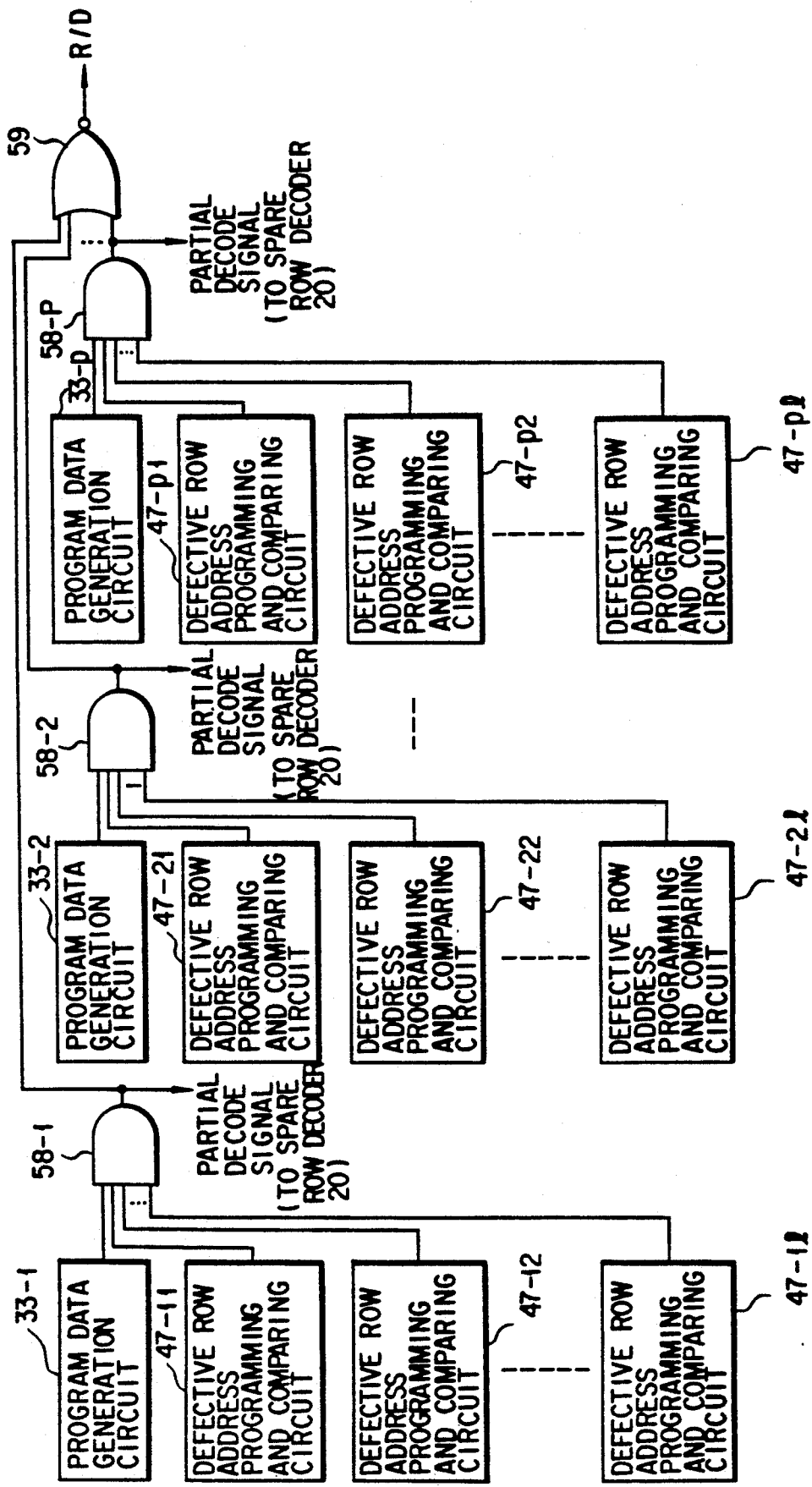
FIG. 5 is a block diagram showing an example of the construction of a programming circuit and a spare decoder in the circuit of FIG. 4.

FIG. 5 shows the construction of part of the programming circuit 18 and spare row decoder 19 in the RAM shown in FIG. 4. The programming circuit 18 includes program data generation circuits 33-1 to 33-$p$ and defective row address programming and comparing circuits 47-11 to 47-pl. The program data generation circuits 33-1 to 33-$p$ are programmed to have information indicating whether the redundant function is used or not for respective rows of the spare word lines. Each of the defective row address programming and comparing circuits 47-11 to 47-pl is programmed to store a bit signal which is part of a corresponding defective row address and compares the defective row address programmed therein with an internal row address signal to check whether the compared addresses coincide with each other or not. The spare decoder 19 includes AND gates 58-1 to 58-p and a NOR gate 59. Output signals of the program data generation circuit 33-1 and defective address programming and comparing circuits 47-11 to 47-1l are supplied to the AND gate 58-1. Output signals of the program data generation circuit 33-2 and defective address programming and comparing circuits 47-21 to 47-2l are supplied to the AND gate 58-2. Likewise, output signals of the other program data generation circuits and defective address programming and comparing circuits are supplied to the respective AND gates and, for example, output signals of the program data generation circuit 33-p and defective address programming and comparing circuits 47-pl to 47-pl are supplied to the AND gate 58-p. Outputs of the AND gates 58-1 to 58-p are supplied to the spare row decoder 20 as partial decode signals and supplied to the NOR gate 59 which in turn outputs a control signal R/D.

FIG. 6 shows an example of the detail construction of each of the program data generation circuits 33-1 to 33-p in the circuit of FIG. 5. Each of the circuits 33-1 to 33-p includes a fuse 31, CMOS transfer gates 36, 39, 2-input NAND gate 40, inverters 41, 42, resistor 43, capacitors 44, 45 and N-channel MOS transistor 46. The transfer gate 36 is constructed by a P-channel MOS transistor 34 and an N-channel MOS transistor 35 whose current paths are connected in parallel and the transfer gate 39 is constructed by a P-channel MOS transistor 37 and an N-channel MOS transistor 38 whose current paths are connected in parallel. One end of the transfer gate 36 is connected to a power source Vcc, one end of the transfer gate 39 is connected to a ground terminal Vss, and the other ends of the transfer gates are commonly connected to one input terminal of the NAND gate 40. The other input terminal of the NAND gate 40 is connected to the power source Vcc and an output signal thereof is supplied to the input terminal of the inverter 41. One end of the fuse 31 is connected to the power source Vcc and the other end thereof is connected to the gates of the MOS transistors 34, 38, one end of the resistor 43, one electrode of the capacitor 44, the drain of the MOS transistor 46 and the input terminal of the inverter 42. The other end of the resistor 43, the other electrode of the capacitor 44 and the source of the MOS transistor 46 are connected to the ground terminal Vss. The output terminal of the inverter 42 is connected to the gates of the MOS transistors 35, 37 and 46. The capacitor 45 is connected between the output terminal of the inverter 42 and the power source Vcc.

When the fuse 31 is cut off, the resistor 43 is used as a level setting means for setting the gates of the MOS transistors 34, 38 to the ground potential Vss and the MOS transistor 46 is used as a level holding means for stably holding the thus set ground potential Vss. The capacitors 44 and 45 are used for signal delay.

FIG. 7 shows an example of the detail construction of each of the defective address programming and comparing circuits 47-11 to 47-pl in the circuit of FIG. 5. Each of the defective address programming and comparing circuits 47-11 to 47-pl can be programmed to store a bit signal which is part of the corresponding defective row address and compares the defective row address programmed therein with an internal row address signal supplied from the address buffer 15 to check whether or not the compared addresses coincide with each other. Each of the circuits 47-11 to 47-pl includes a fuse 32-1 to 32-r, CMOS transfer gates 50-1 to 50-q (q=2r), r-input NAND gate 51, inverters 52 and 53-1 to 53-r, resistor 54-1 to 54-r, capacitors 55-1 to 55-r and 56-1 to 56-r, and N-channel MOS transistors 57-1 to 57-r. Each of the transfer gates 50-1 to 50-q is constructed by a corresponding one of P-channel MOS transistors 48-1 to 48-q and a corresponding one of N-channel MOS transistors 49-1 to 49-q whose current paths are connected in parallel. Adjacent two of the transfer gates 50-1 to 50-q make a pair, and one end of one of the two transfer gates of each pair is supplied with a corresponding one of bits Xj to Xi of the internal row address signal and one end of the other transfer gate of each pair is supplied with a corresponding one of bits $\overline{Xj}$ to $\overline{Xi}$ of the inverted signal of the internal row address signal. The other ends of the transfer gates 50-1 to 50-q are connected to input terminals of the NAND gate 51. The output terminal of the NAND gate 51 is connected to the input terminal of the inverter 52 whose output is supplied to the AND gate 58 in the circuit of FIG. 5. One end of the fuse 32-1 is connected to the power source Vcc and the other end thereof is connected to the gates of the MOS transistors 48-1 and 49-2, one end of the resistor 54-1, one electrode of the capacitor 55-1, drain of the MOS transistor 57-1 and input terminal of the inverter 53-1. More specifically, the other end of the fuse 32-1 is connected to the gate of the P-channel MOS transistor 48-1 in one of the transfer gates 50-1 and 50-2 which is supplied with the internal address signal Xj at one end and connected to the gate of the N-channel MOS transistor 49-2 in one of the transfer gates 50-1 and 50-2 which is supplied with the inverted signal $\overline{Xj}$ of the internal address signal at one end. The other end of the resistor 54-1, the other electrode of the capacitor 55-1 and the source of the MOS transistor 57-1 are connected to the ground terminal Vss. The output terminal of the inverter 53-1 is connected to the gates of the MOS transistors 49-1 and 48-2, and the gate of the MOS transistor 57-1. More specifically, the output terminal of the inverter 53-1 is connected to the gate of the N-channel MOS transistor 49-1 in one of the transfer gates 50-1 and 50-2 which is supplied with the internal address signal Xj at one end and connected to the gate of the P-channel MOS transistor 48-2 in one of the transfer gates 50-1 and 50-2 which is supplied with the inverted signal $\overline{Xj}$ of the internal address signal at one end. The capacitor 56-1 is connected between the output terminal of the inverter 53-1 and the power source Vcc.

The other construction including fuses 32-2 to 32-r, transfer gates 50-2 to 50-q, inverters 53-2 to 53-r, resistors 54-2 to 54-r, capacitors 55-2 to 55-r and 56-2 to 56-r and transistors 57-2 to 57-r are substantially the same as that of circuit.

When the fuses 32-1 to 32-r are cut off, the resistors 54-1 to 54-r are used as a level setting means for setting the gates of the MOS transistors 48-1, 49-2, ..., 48-(q-1), 49-q to the ground potential Vss and the MOS transistors 57-1 to 57-r are used as a level holding means for stably holding the thus set ground potential Vss. The capacitors 55-1 to 55-r and 56-1 to 56-r are used for signal delay.

Figure 8:
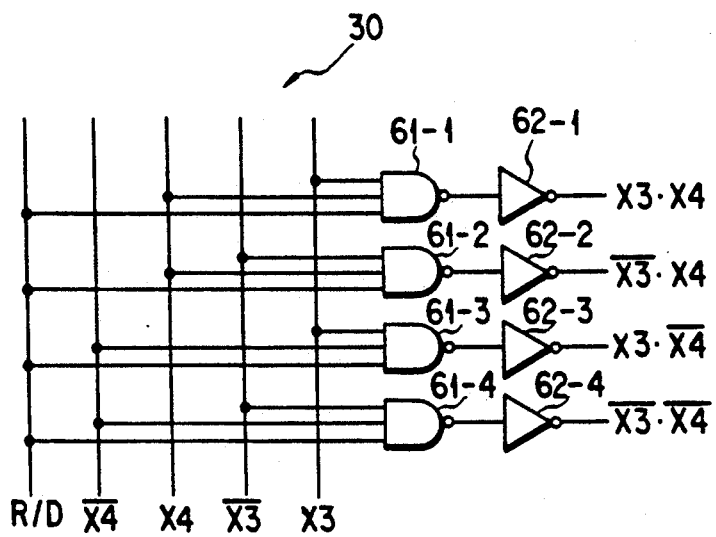
FIG. 8 is a circuit diagram showing an example of the construction of a row partial decoder in the circuit of FIG. 4.

FIG. 8 is a circuit diagram showing the detail construction of the row partial decoder 30 in the RAM shown in FIG. 4. The row partial decoder 30 includes 3-input NAND gates 61-1 to 61-4 and inverters 62-1 to 62-4 for inverting outputs of the NAND gates 61-1 to 61-4. The decoder 30 is supplied with selected two bits of 2-bit internal row addresses X3, $\overline{X3}$, X4, $\overline{X4}$, for example, in addition to the control signal R/D. The NAND gates 61-1 to 61-4 and inverters 62-1 to 62-4 create partial decode signals having four different combinations constructed by AND logic signals of the control signal R/D and the respective address signals X3 and X4, $\overline{X3}$ and X4, X3 and $\overline{X4}$, and $\overline{X3}$ and $\overline{X4}$. The partial decode signals are supplied to the main row decoder 17. AND gates may be used instead of the NAND gates 61-1 to 61-4 and inverters 62-1 to 62-4.

The row partial decoder 16A of FIG. 4 is similar to the circuit of FIG. 8 except that the control signal R/D is not supplied thereto and the row partial decoder 16A creates partial decode signals having four different combinations based on 2-bit internal row address signals X1, $\overline{X1}$, X2, $\overline{X2}$, for example.

Figure 9:
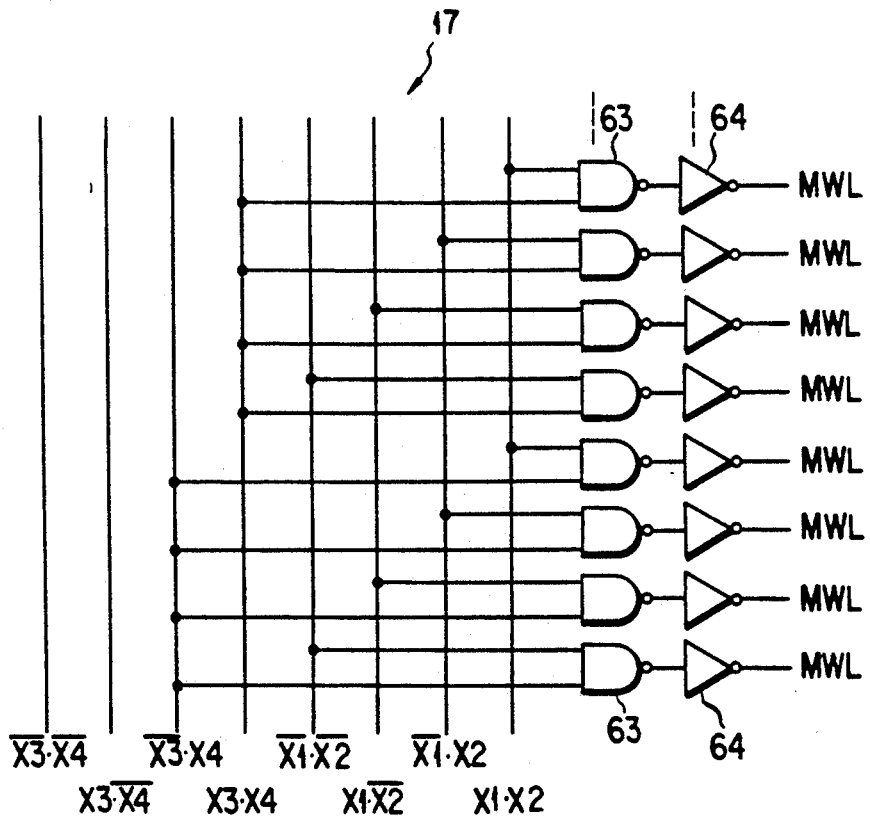
FIG. 9 is a circuit diagram showing an example of the construction of part of a main row decoder in the circuit of FIG. 4.

FIG. 9 is a circuit diagram showing the detail construction of part of the main row decoder 17 in the RAM of FIG. 4. The main row decoder 17 includes 16 decoding NAND gates 63 and 16 inverters 64 for inverting the outputs of the NAND gates. The decoder 17 is supplied with partial decode signals having eight different combinations obtained in the row partial decoders 16A, 30. In FIG. 9, eight NAND gates 63 and inverters 64 are typically shown.

The NAND gate 63 and inverter 64 create an AND logic signal of two different partial decode signals. The AND logic signals are respectively supplied to main word lines MWL (MWL1 to MWLm). Also, in this circuit, AND gates can be used instead of the NAND gates 63 and inverters 64.

Next, the operation of the RAM with the construction shown in FIGS. 4 to 9 is explained. First, the operation in which no redundant function is used is explained.

In each of the program data generation circuits 33-1 to 33-p shown in FIG. 6, whether the redundant function is used or not is programmed by cutting off the fuse 31 or keeping the fuse as it is and a signal of a logic level corresponding to the program is output from the inverter 41. When the redundant function is not used, the fuse 31 is not cut off, and when the redundant function is used, the fuse 31 is cut off. Since the MOS transistors 38 and 34 are respectively turned on and off and an output of the inverter 42 is set at the low logic level in a case where the fuse 31 is not cut off, the MOS transistors 37 and 35 are respectively turned on and off. At this time, the MOS transistor 46 is turned off. As a result, the transfer gates 39 and 36 are respectively turned on and off and one input terminal of the NAND gate 40 is set to the ground potential Vss (low logic level). Therefore, an output of the NAND gate 40 is set to the high logic level and an output of the inverter 41 is set to the low logic level.

As a result, the AND gates 58-1 to 58-p are set to the low logic level and the control signal R/D is set to the high logic level. Since all of the partial decode signals output from the spare decoder 19 are set at the low logic level, none of the spare word lines SWL1 to SWLp in the spare memory cell array 12 are selected. Further, since the control signal R/D supplied to the row partial decoder 30 is set at the high logic level, the NAND gates 61-1 to 61-4 shown in FIG. 8 are made operative and partial decode signals of the address signals X3, $\overline{X3}$, X4, $\overline{X4}$ are output from the row partial decoder 30. At this time, partial decode signals of the address signals X1, $\overline{X1}$, X2, $\overline{X2}$ are also supplied from the row partial decoder 16A which is not supplied with the control signal R/D. The main row decoder 17 selects one of the main word lines MWL1 to MWLm based on the partial decode signals supplied from the row partial decoders 16A, 30 and outputs a selection signal of high logic level.

At this time, the column decoder 22 turns on the two MOS transistors in the column selection circuit 21 selected based on an input internal column address signal. As a result, one pair of bit lines BL and $\overline{BL}$ connected to the column selection circuit 21 are selected and data write in or data readout is effected by means of a write-/read circuit (not shown) with respect to one of the memory cells 13 which is disposed at an intersection between the main word line MWL selected by the main row decoder 17 and the selected pair of bit lines BL and $\overline{BL}$.

With the above construction, since the control signal R/D output from the spare decoder 19 is supplied only to the NAND gates 61-1 to 61-4 in the row partial decoder 30, the number of gates driven by the control signal R/D can be reduced to ¼ times the number of gates driven when the signal is supplied to all of the NAND gates in the main row decoder as in the conventional case. As a result, the load capacitance of the control signal R/D can be reduced and the rising speed of the control signal R/D to the high logic level is increased as shown by the timing chart in FIG. 10 so that the access time can be shortened and the access speed can be enhanced.

In a case where the redundant function is used, one of the fuses 31 of the program data generation circuits 33-1 to 33-p corresponding to a spare row to be used is cut off and one of the fuses 32 of the defective row address programming and comparing circuits 47-11 to 47-pl corresponding to the defective row address is cut off.

When the fuse 31 is cut off, the gates of the MOS transistors 34, 38 are connected to the ground terminal Vss via the resistor 43 and the MOS transistors 34 and 38 are respectively turned on and off. After this, since the an output of the inverter 42 is set to the high logic level, the MOS transistors 35 and 37 are respectively turned on and off. At this time, the MOS transistor 46 is turned on to stably hold the gate potentials of the MOS transistors 34 and 38 and the input potential of the inverter 42 at the ground potential Vss. As a result, the transfer gates 36 and 39 are respectively turned on and off to set one of the input terminals of the NAND gate 40 to the power source potential Vcc (high logic level). As a result, an output of the NAND gate 40 is set to the low logic level and an output of the inverter 41 is set to the high logic level.

The fuses 32 in the defective row address programming and comparing circuits 47-11 to 47-pl are selectively cut off according to the defective row addresses. More specifically, in the defective row address programming and comparing circuit 47 shown in FIG. 7, the fuse 32-1 is cut off when the defective row address signal Xj is at the high logic level, and it is not cut off when the signal Xj is at the low logic level. For example, in FIG. 7, when the defective row address signal Xj is at the high logic level, the fuse 32-1 is cut off. Therefore, the transfer gate 50-1 which is supplied with the non-inverted row address signal Xj at one end, is turned on and, when the row address signal $X_j$ is at the high logical level, the output of the transfer gate 50-1 is set to the high logical level. When the defective row address signal $X_i$ is at the low logical level, the fuse 32-$r$ is not cut off. Therefore, the transfer gate 50-$q$ which is supplied with the inverted row address signal $\overline{X_i}$, is turned on and, when the row address signal $X_i$ is at the low logic level, the output of the transfer gate 50-$q$ is set to the high logic level. In this manner, the fuses 32-1 to 32-$r$ are selectively cut off according to the defective row address signals $X_i$ to $X_j$, and the defective addresses are programmed. When all the input row address signals $X_i$ to $X_j$ coincide with the defective address signals $X_i$ to $X_j$, the outputs of the turned-on transfer gates of transfer gates 50-1 to 50-$q$ are all set to the high logic level, the output of the NAND gate 51 is set to the low logic level, and the output of the inverter 52 is set to the high logic level.

Assume in FIG. 5 that the fuse 31 in the program data generation circuit 33-1 is cut off, and the fuses 32 in the defective row address programming and comparing circuits 47-11 to 47-1l are selectively cut off according to the defective row address signals. If the input row address signals coincide with the defective row address signals, all the inverters 52 in the defective row address programming and comparing circuits 47-11 to 47-1l output high logic level signals. Since the inverter 41 in the program data generation circuit 33-1 outputs a high logic level signal, the AND gate 58-1 outputs a high logic level signal. Then, the output of the NOR gate 59 in the spare decoder 19, that is, the control signal R/D is set to the low logic level.

As described above, one of the outputs of the AND gates 58-1 to 58-$p$ is set to the high logic level, and the output of the NOR gate 59 in the spare decoder 19, that is, the control signal R/D is set to the low logic level. When the control signal R/D is set at the low logic level, outputs of all of the NAND gates 61-1 to 61-4 in the row partial decoder 30 are set to the high logic level and outputs of all of the inverters 62-1 to 62-4 are set to the low logic level. As a result, the main row decoder 17 selects none of the main word lines MWL1 to MWLm. On the other hand, the spare row decoder 20 drives one of the spare word lines SWL1 to SWLp in response to the partial decode signals in the defective row address programming and comparing circuits 47. As a result, a memory cell in the spare memory cell array 12 is selected, and thus the defective memory cell in the main memory cell array 11 is replaced by the spare memory cell in the in the spare memory cell array 12 for each row.

With the above construction, since the load capacitance for the control signal R/D is small when the state in which a memory cell in the main memory cell array 11 is selected is changed to the state in which a memory cell in the spare memory cell array 12 is selected, that is, when the control signal R/D is changed from the high logic level to the low logic level, time required for changing the state from the selection state to the non-selection state can be made short and the possibility of multiselection becomes low. Therefore, it is not necessary to increase the driving ability of a buffer circuit (which is the NOR gate 59 in FIG. 5, for example) for outputting the control signal R/D and an increase in the current consumption can be prevented.

Figure 11:
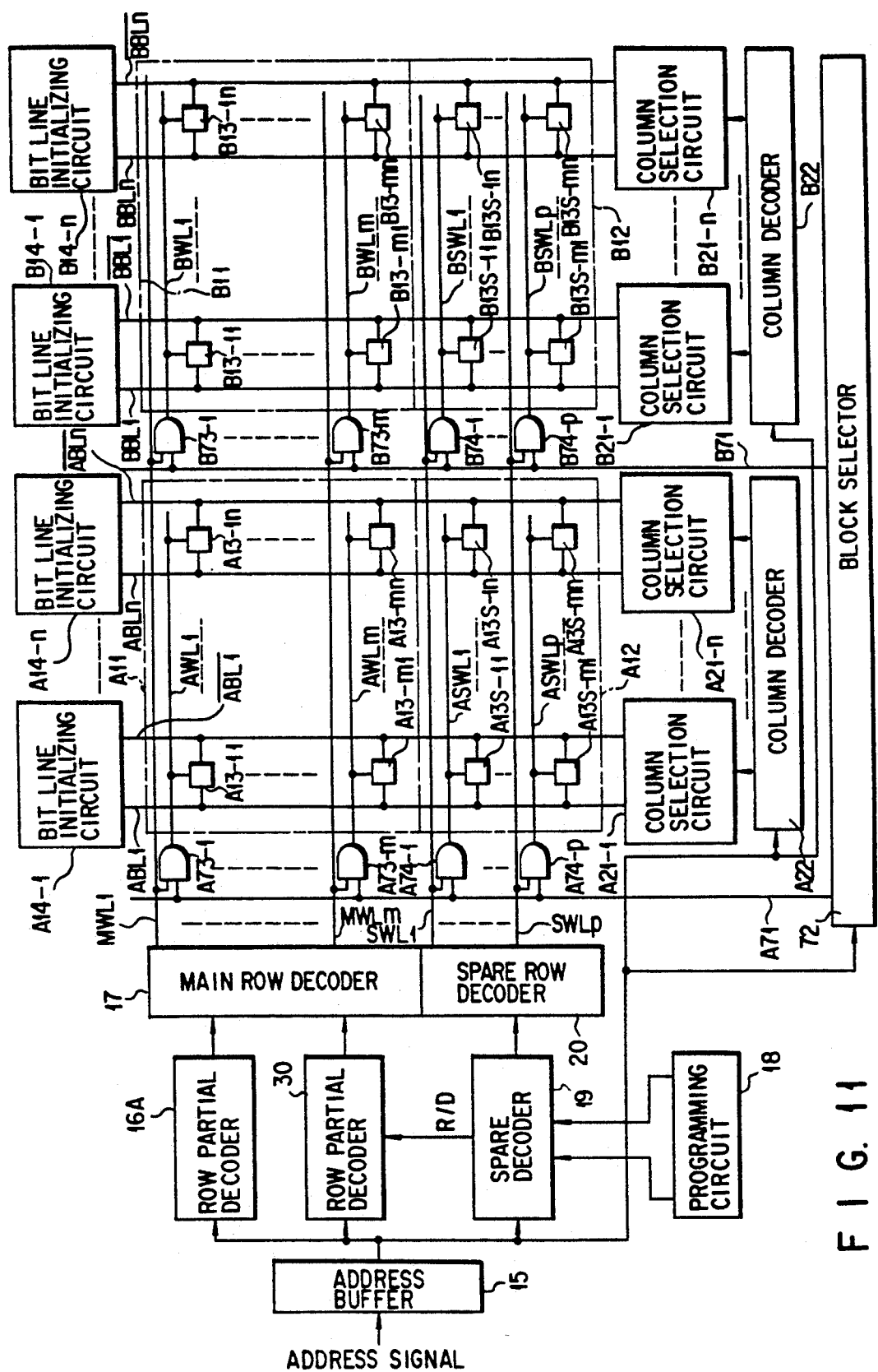
FIG. 11 is a block diagram showing the schematic construction of a semiconductor memory device according to a second embodiment of this invention.

FIG. 11 is a block diagram showing a semiconductor memory device according to a second embodiment of this invention. In the second embodiment, this invention is applied to a RAM of double word line system. In the double word line system, a plurality of main memory cell arrays A11, B11 (in an example of FIG. 11, in order to simplify the explanation and the drawing, two memory cell arrays are shown, but three or more memory cell arrays may be used) and spare memory cell arrays A12, B12 for the memory cell arrays A11, B11 are provided. Word lines AWL1 to AWLm, BWL1 to BWLm are connected to the main memory cell arrays A11, B11 for respective rows of memory cells. Main word lines MWL1 to MWLm are formed to correspond to the respective rows of the word lines AWL1 to AWLm and the respective rows of the word lines BWL1 to BWLm, formed to extend across the main memory cell arrays A11, B11, and selectively driven by outputs of a main row decoder 17. Likewise, first spare word lines ASWL1 to ASWLp, BSWL1 to BSWLp are connected to the spare memory cell arrays A12, B12 for respective rows of spare memory cells. Second spare word lines SWL1 to SWLp are formed to correspond to the respective rows of the first spare word lines ASWL1 to ASWLp, BSWL1 to BSWLp, formed to extend across the spare memory cell arrays A12, B12, and selectively driven by outputs of a spare row decoder 20. Selection lines A71, B71 for selecting the arrays A11 and A12, or B11 and B12 are respectively formed in the arrays A11 and A12 and the arrays B11 and B12 to extend in the same direction as bit lines. The selection lines A71, B71 are supplied with outputs of a block selector 72. The block selector 72 is supplied with an internal column address signal from an address buffer 15. AND gates A73-1 to A73-$m$, B73-1 to B73-$m$ are arranged at intersections between the main word lines MWL1 to MWLm and the selection lines A71, B71. Further, AND gates A74-1 to A74-$p$, B74-1 to B74-$p$ are arranged at intersections between the spare word lines SWL1 to SWLp and the selection lines A71, B71. The first input terminals of the AND gates A73-1 to A73-$m$ are respectively connected to the main word lines MWL1 to MWLm, the second input terminals thereof are connected to the selection line A71, and the output terminals thereof are respectively connected to the word lines AWL1 to AWLm. The first input terminals of the AND gates B73-1 to B73-$m$ are respectively connected to the main word lines MWL1 to MWLm, the second input terminals thereof are connected to the selection line B71, and the output terminals thereof are respectively connected to the word lines BWL1 to BWLm. The first input terminals of the AND gates A74-1 to A74-$p$ are respectively connected to the second spare word lines SWL1 to SWLp, the second input terminals thereof are connected to the selection line A71, and the output terminals thereof are respectively connected to the first spare word lines ASWL1 to ASWLp. The first input terminals of the AND gates B74-1 to B74-$p$ are respectively connected to the second spare word lines SWL1 to SWLp, the second input terminals thereof are connected to the selection line B71, and the output terminals thereof are respectively connected to the first spare word lines BSWL1 to BSWLp.

Bit line pairs ABL1, $\overline{ABL1}$ to ABLn, $\overline{ABLn}$, BBL1, $\overline{BBL1}$ to BBLn, $\overline{BBLn}$, main memory cells A13-11 to A13-mn, B13-11 to B13-mn, spare memory cells A13S-11 to A13S-pn, B13S-11 to B13S-pn, bit line initializing circuits A14-1 to A14-$n$, B14-1 to B14-$n$, column selection circuits A21-1 to A21-$n$, B21-1 to B21-$n$, and column decoders A22, B22 are arranged in each array in the same manner as shown in FIG. 4. The other construction including an address buffer 15, row partial decoders 16A, 30, main row decoder 17, programming circuit 18, spare decoder 19, spare row decoder 20 and the like is also substantially the same as that of FIG. 4.

With the construction of the second embodiment, one of the word lines AWL to AWLm and BWL1 to BWLm is selected by use of the main word lines MWL1 to MWLm and the selection lines A71, B71, and one of the first spare word lines ASWL1 to ASWLp and BSWL1 to BSWLp is selected by use of the second spare word lines SWL1 to SWLp and the selection lines A71, B71. At this time, the defective word line or the defective memory cell in the main memory cell array A11 can be replaced by a word line or a memory cell in the spare memory cell array A12 and the defective word line or the defective memory cell in the main memory cell array B11 can be replaced by a word line or a memory cell in the spare memory cell array B12. The other basic operation is the same as that of the first embodiment and substantially the same effect can be attained.

This invention is not limited to the above first and second embodiments and can be variously modified without departing from the technical scope thereof.

What is claimed is:

1. A semiconductor memory device comprising:
   a main memory cell array having memory cells arranged in a matrix form;
   main word lines each connected to those of said memory cells of said main memory cell array which are arranged on a corresponding row;
   a spare memory cell array having spare memory cells arranged in a matrix form, the spare memory cells of the same number as the memory cells connected to each of said main word lines being arranged on each row of said spare memory cell array;
   spare word lines each connected to those of said spare memory cells of said spare memory cell array which are arranged on a corresponding row;
   spare decoder means having a defective row address programmed therein when at least one of said memory cells of said main memory cell array or at least one of said main word lines becomes defective, comparing the programmed defective row address with an input row address signal to check whether or not the compared addresses coincide with each other, outputting a control signal corresponding to the coincidence/non-coincidence of the compared row addresses, and outputting a first partial decode signal of the input address signal when the compared addresses coincide with each other;
   spare row decoder means for receiving the first partial decode signal and selectively driving said spare word lines;
   row partial decoder means for receiving the input row address signal and the control signal and outputting a second partial decode signal of the input row address signal when the control signal indicates the non-coincidence of the addresses; and
   main row decoder means for decoding the second partial decode signal and selectively driving said main word lines.

2. A semiconductor memory device according to claim 1, wherein said row partial decoder means includes a first row partial decoder for decoding a row address signal supplied from an address buffer and outputting a first partial decode signal, and a second row partial decoder for decoding the row address signal supplied from said address buffer and outputting a second partial decode signal in response to the control signal.

3. A semiconductor memory device according to claim 2, wherein said second partial decoder includes logic means for deriving the logical product of the control signal and a plurality of selected bits in the row address signal supplied from said address buffer and outputting the second partial decode signal.

4. A semiconductor memory device according to claim 2, wherein said second partial decoder includes a plurality of NAND gates for receiving the control signal and a plurality of selected bits in the row address signal supplied from said address buffer, and inverters for inverting respective output signals of said NAND gates and outputting the second partial decode signal.

5. A semiconductor memory device according to claim 1, further comprising bit lines each connected to those of said memory cells of said main memory cell array and said spare memory cells of said spare memory cell array which are arranged on a corresponding column, and column decoder means for decoding a column address signal to selectively drive said bit lines.

6. A semiconductor memory device according to claim 1, further comprising bit line pairs each connected to those of said memory cells of said main memory cell array and said spare memory cells of said spare memory cell array which are arranged on a corresponding column, and column decoder means for decoding a column address signal to selectively activate said bit line pairs.

7. A semiconductor memory device according to claim 6, further comprising bit line initializing means for initializing the potential of said bit line pairs, and column selection means for selectively activating said bit line pairs in response to a column decode signal output from said column decoder means.

8. A semiconductor memory device comprising:
   a plurality of main memory cell arrays each having memory cells arranged in a matrix form;
   word lines each connected to those of said memory cells in each of said main memory cell arrays which are arranged on a corresponding row;
   main word lines each disposed for those of said memory cells of said plurality of main memory cell arrays which are arranged on a corresponding row;
   a plurality of spare memory cell arrays each having spare memory cells arranged in a matrix form, the spare memory cells of the same number as the memory cells connected to each of said word lines being arranged on each row of each of said spare memory cell arrays;
   first spare word lines each connected to those of said spare memory cells in each of said spare memory cell arrays which are arranged on a corresponding row;
   second spare word lines each disposed for those of said spare memory cells which have the same row address in said plurality of spare memory cell arrays;
   selection means for selecting one of said plurality of main memory cell arrays and selecting one of said plurality of spare memory cell arrays which corresponds to said selected main memory cell array;
   first driving means for driving one of said word lines selected by said selection means and one of said main word lines;

second driving means for driving one of said first spare word lines selected by said selection means and one of said second spare word lines;

spare decoder means having a defective row address programmed therein when at least one of said memory cells of said plurality of main memory cell arrays and said main word lines becomes defective, comparing the programmed defective row address with an input row address signal to check whether or not the compared addresses coincide with each other, outputting a control signal corresponding to the coincidence/non-coincidence of the compared row addresses, and outputting a first partial decode signal of the input row address signal when the compared row addresses coincide with each other;

spare row decoder means for decoding the first partial decode signal and selectively driving said second spare word lines;

row partial decoder means for receiving the input row address signal and the control signal and outputting a second partial decode signal of the input row address signal when the control signal indicates the non-coincidence of the addresses; and main row decoder means for decoding the second partial decode signal and selectively driving said main word lines.

9. A semiconductor memory device according to claim 8, wherein said row partial decoder means includes a first row partial decoder for decoding a row address signal supplied from an address buffer and outputting a first partial decode signal, and a second row partial decoder for decoding the row address signal supplied from said address buffer and outputting a second partial decode signal in response to the control signal.

10. A semiconductor memory device according to claim 9, wherein said second partial decoder includes logic means for deriving the logical products of the control signal and a plurality of selected bits in the row address signal supplied from said address buffer and outputting the second partial decode signal.

11. A semiconductor memory device according to claim 9, wherein said second partial decoder includes a plurality of NAND gates for receiving the control signal and a plurality of selected bits in the row address signal supplied from said address buffer, and inverters for inverting respective output signals of said NAND gates and outputting the second partial decode signal.

12. A semiconductor memory device according to claim 8, further comprising bit lines each connected to those of said memory cells of said plurality of main memory cell arrays and said spare memory cells of said plurality of spare memory cell arrays which are arranged on a corresponding column, and column decoder means for decoding a column address signal and selectively driving said bit lines.

13. A semiconductor memory device according to claim 8, further comprising bit line pairs each connected to those of said memory cells of said plurality of main memory cell arrays and said spare memory cells of said plurality of spare memory cell arrays which are arranged on a corresponding column, and column decoder means for decoding a column address signal and selectively activating said bit line pairs.

14. A semiconductor memory device according to claim 13, further comprising bit line initializing means for initializing the potential of said bit line pairs, and column selection means for selectively activating said bit line pairs in response to a column decode signal output from said column decoder means.

* * * * *